(12) United States Patent
Milla et al.

(10) Patent No.: US 7,045,390 B2
(45) Date of Patent: May 16, 2006

(54) STACKED DIE PACKAGE

(75) Inventors: Juan G. Milla, Mesa, AZ (US); Robert L. Hubbard, Mesa, AZ (US)

(73) Assignee: Medtronic, Inc., Minneapolis, MN (US)

( * ) Notice: Subject to any disclaimer, the term of this patent is extended or adjusted under 35 U.S.C. 154(b) by 277 days.

(21) Appl. No.: 10/413,320

(22) Filed: Apr. 15, 2003

(65) Prior Publication Data

US 2003/0180987 A1 Sep. 25, 2003

Related U.S. Application Data

(62) Division of application No. 09/734,073, filed on Dec. 11, 2000, now abandoned.

(51) Int. Cl.
*H01L 21/44* (2006.01)

(52) U.S. Cl. ...................................... 438/109

(58) Field of Classification Search ................ 438/106, 438/109, 112, 118, 124; 257/723, 724
See application file for complete search history.

(56) References Cited

U.S. PATENT DOCUMENTS

| 5,012,323 | A | 4/1991 | Farnworth |
| 5,281,852 | A | 1/1994 | Normington |
| 5,291,061 | A | 3/1994 | Ball |
| 5,345,205 | A | 9/1994 | Kornrumpf |
| 5,386,341 | A | 1/1995 | Olson et al. |
| 5,397,747 | A | 3/1995 | Angiulli et al. |
| 5,428,190 | A | 6/1995 | Stopperan |
| 5,448,511 | A | 9/1995 | Paurus et al. |
| 5,452,182 | A | 9/1995 | Eichelberger et al. |
| 5,646,446 | A | * | 7/1997 | Nicewarner et al. ........ 257/723 |
| 5,696,031 | A | | 12/1997 | Wark |
| 5,721,452 | A | | 2/1998 | Fogal et al. |
| 5,776,797 | A | | 7/1998 | Nicewarner, Jr. et al. |
| 5,953,588 | A | | 9/1999 | Camien et al. |
| 5,963,794 | A | | 10/1999 | Fogal et al. |
| RE36,613 | E | | 3/2000 | Ball |
| 6,051,886 | A | | 4/2000 | Fogal et al. |
| 6,121,676 | A | | 9/2000 | Solberg |
| 6,225,688 | B1 | | 5/2001 | Kim et al. |
| 2001/0006252 | A1 | | 7/2001 | Kim et al. |
| 2002/0044423 | A1 | | 4/2002 | Primavera et al. |
| 2002/0123172 | A1 | | 9/2002 | Milla et al. |
| 2002/0127837 | A1 | | 9/2002 | Milla |

FOREIGN PATENT DOCUMENTS

| CH | 689 502 A5 | 5/1999 |
| EP | 1 041 633 A1 | 10/2000 |
| EP | 1 119 049 A2 | 7/2001 |
| TW | 272 352 | 3/1996 |

OTHER PUBLICATIONS

"Stepped Pyramid Chip Stack," Research Disclosure No. 413088, IBMC, p. 1234-1235 (Sep. 1998).

* cited by examiner

*Primary Examiner*—Matthew Smith
*Assistant Examiner*—Lex H. Malsawma
(74) *Attorney, Agent, or Firm*—Girma Wolde-Michael; Caroline F. Barry

(57) ABSTRACT

A stacked die package is formed by stiffening a flexible substrate, arranging a chip mounting pattern on one side of the substrate, and mounting chips according to the arranged pattern. A solder ball array on the opposite side of the substrate is routed to the chips, and the flexible substrate and stiffener are folded to align the chips in the stacked die package. The stiffener is removed by a single saw cut.

22 Claims, 5 Drawing Sheets

STACKED DIE PACKAGE

This application is a divisional of application Ser. No. 09/734,073, filed Dec. 11, 2000, now abandoned.

FIELD OF THE INVENTION

The present invention relates generally to implantable medical devices (IMDs) incorporating stacked die packages. Specifically, the invention pertains to stacked die configurations adapted for use in IMDs.

BACKGROUND OF THE INVENTION

As implantable medical devices become smaller and smaller, and as more and more components are added to such devices, the real estate available for components is shrinking. Components too are shrinking in size, but the need for improving the use of available volume and space continues.

In implantable medical devices, the footprints of dice and stacked dice packages typically exceed the bottom die size. For example, when wire bonding is used to electrically connect a die to rigid or flexible interposers, the package size is much larger than the bottom die size, and is therefore very size inefficient.

One stacked die package in the industry uses a structure having a number of chips glued to one side of a substrate, and a connection array also laid out on the same side of the substrate. The chips are stacked by repeated hand-folding and adhering. This structure requires that perforations be placed along bend lines of the substrate to allow bending along precisely the correct lines. Further, each individual stacked package is cut individually once the substrate is folded.

SUMMARY OF THE INVENTION

In one embodiment, a method for making a stacked die package includes mounting at least two chips on a first side of a flexible substrate, forming solder balls on a second side of the substrate, and interconnecting the chips and the solder balls through the substrate. Once the chips are interconnected with the solder balls, the chips are stacked, and the stacked device is surface mounted.

In another embodiment, a method for forming a stacked die package includes stiffening a flexible substrate with a stiffener frame, forming an array of mounting elements on a first side of the flexible substrate, positioning the substrate mounting elements down on a reflow boat or foundation, and mounting and reflowing a number of chips on a second side of the flexible substrate in a predetermined pattern. Once the chips are mounted, they are stacked, and the substrate stiffener is removed.

In yet another embodiment, a stacked die array includes a stacked array of chips adhered together on a flexible substrate folded to accommodate mounting, a surface mount element on a side of the substrate opposite the chips, and through-substrate routing electrically connecting the chips and the surface mount element.

In still another embodiment, an IMD includes a device body and a stacked chip array mounted by conventional surface mount techniques to a printed circuit board.

Other embodiments are described and claimed as described hereinbelow.

DETAILED DESCRIPTION OF THE DRAWINGS

In the following detailed description of the embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention.

Figures 1, 1A:
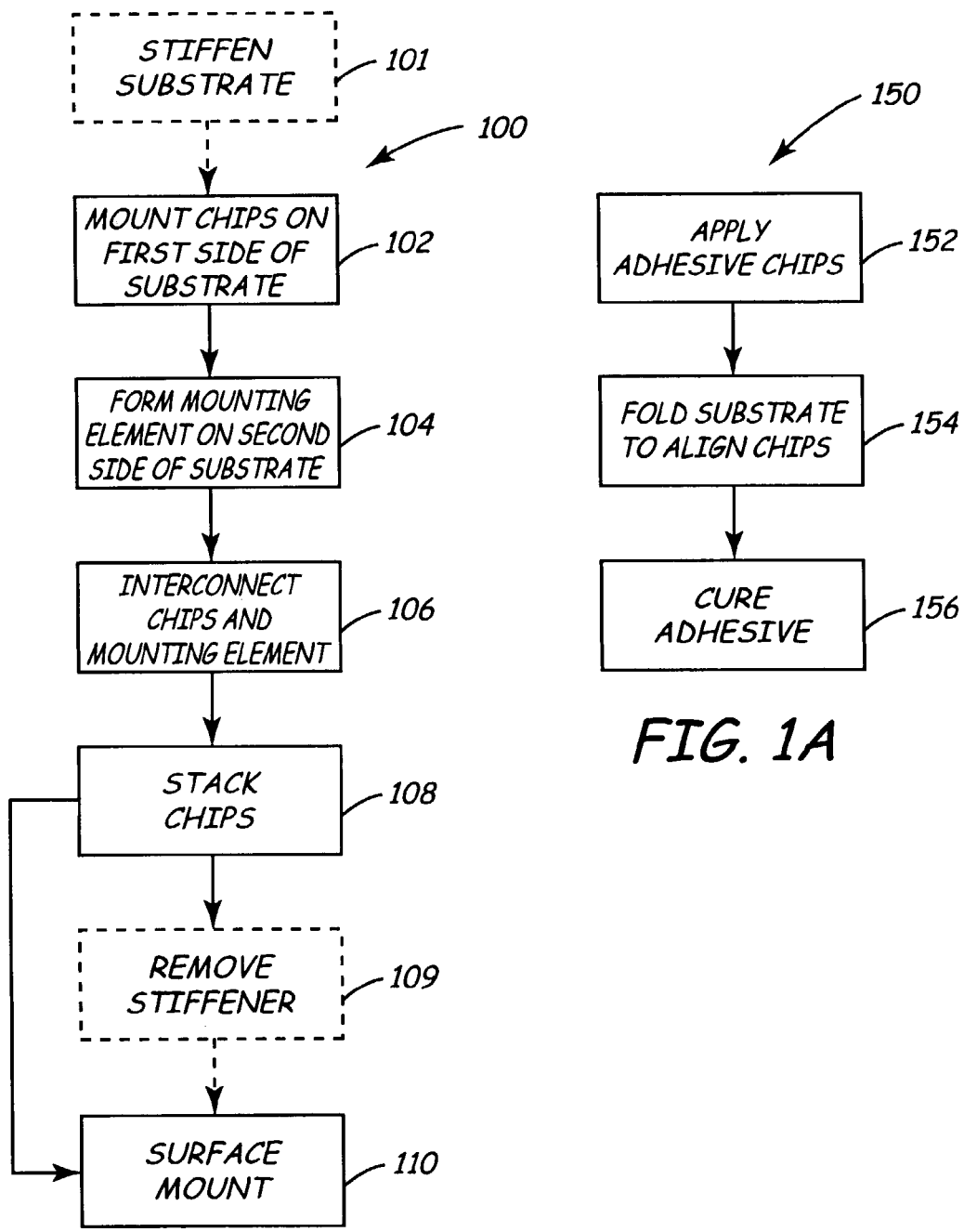
FIG. 1 is a flow chart diagram of one embodiment of a method for making a stacked die package.
FIG. 1A is a flow chart diagram of one embodiment of a method for stacking chips.

FIG. 1 is a flow chart showing method 100 for making a stacked die package according to one embodiment of the present invention. Method 100 comprises using a flexible substrate as a mounting location for at least two chips in a predetermined pattern. In block 102, the at least two chips are mounted on a first side of the flexible substrate. Solder balls in a predetermined solder ball array patterns are formed on the other side of the flexible substrate in block 104. It should be noted that the mounting of the chips and the solder balls is reversible, with solder ball array being mounted before the chips without departing from the scope of the invention. The mounted chips and the solder ball array are interconnected through the substrate in block 106, and the chips are stacked in a predetermined pattern in block 108. Once the chips are stacked, the stacked die package is surface mounted in block 110.

In one embodiment, the flexible substrate is stiffened with a stiffener in block 101. When the substrate is stiffened, the method becomes more reproducible due to the added rigidity and ability to work on the product. In one embodiment, the substrate is stiffened with a printed wiring board (PWB) stiffener. Other stiffeners include by way of example only and not by way of limitation, metal, screens, and the like. One requisite for a stiffener is that it be amenable to bending when the chips mounted to the substrate are to be stacked.

To mount chips as in block 102, in one embodiment the substrate and any attached stiffener are inverted after applying the solder ball array. Once inverted, the substrate is placed on a reflow boat, and chips are mounted according to a predetermined pattern on the substrate and reflowed. In one embodiment, the predetermined pattern is laid out on the substrate in a sub panel format which has been determined for folding patterns. The layout of sub panel patterns for efficient folding to stack chips is known to those of skill in the field, and will not be described further herein. Provided that the sub panel layout is sufficient for folding and stacking the chips, the layout is consistent with the embodiments of the present invention.

The stiffener allows the substrate to be maintained in a rigid form without the need for a specialized frame to hold the substrate during process flow. Since the stiffener is connected to the substrate, the stiffener is present wherever the substrate is, thus providing rigidity without sacrificing portability during process flow.

In one embodiment, once the chips have been stacked by folding and adhering and curing, and before mounting the stacked die package, the stiffener is removed in block 109. In one embodiment, the stiffener is saw cut away, separating the stiffener and the stacked die package, leaving a stacked die package ready for surface mounting. The arrangement and layout of the substrate and the stiffener allow the stiffener to be fully cut away in a single saw cut, leaving multiple stacked die packages ready for mounting. The sub panel layout allows such a single saw cut to be feasible. In optional process flow, the chips are underfilled.

Stacking the chips in accordance with method 150 shown in FIG. 1A comprises applying an adhesive to the top of selected chips in block 152, and folding the substrate and any attached stiffener in a predetermined fold pattern to align the chips to be stacked top to top with one chip inverted and the other non-inverted in block 154. Once the chips are stacked, the adhesive is cured in block 156.

Figures 2, 2A:
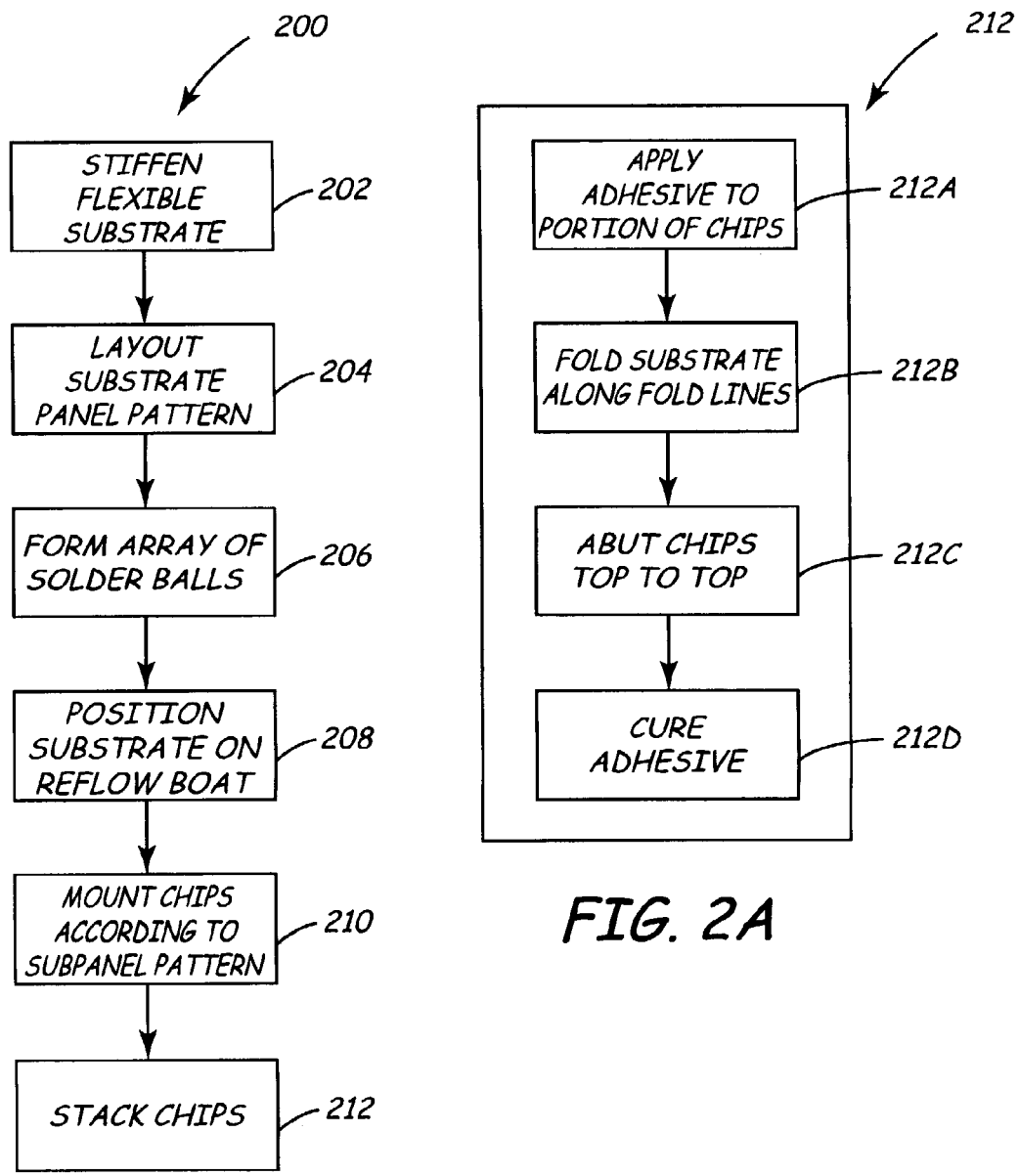
FIG. 2 is a flow chart diagram of another embodiment of a method for forming a stacked die package.
FIG. 2A is a flow chart diagram of another embodiment of a method for stacking chips.

In another embodiment, method 200 for forming a stacked die package is shown in FIG. 2. Method 200 comprises stiffening a flexible substrate in block 202, laying out a sub panel pattern for chip placement on a first side of the substrate in block 204, forming an array of solder balls on the other side of the substrate in block 206, positioning the substrate solder ball array side down on a reflow boat in block 208, and mounting chips according to the laid out pattern in block 210. Once the chips have been mounted, the substrate is folded to stack the chips in a predetermined pattern in block 212. This process, shown in greater detail in FIG. 2A, involves applying an adhesive to at least a portion of the chips in block 212A, folding the substrate along a predetermined fold line or set of fold lines in block 212B, abutting chips top to top in block 212C, and curing the adhesive in block 212D. Once the chips are stacked, the stiffener is removed in block 214.

Figure 3:
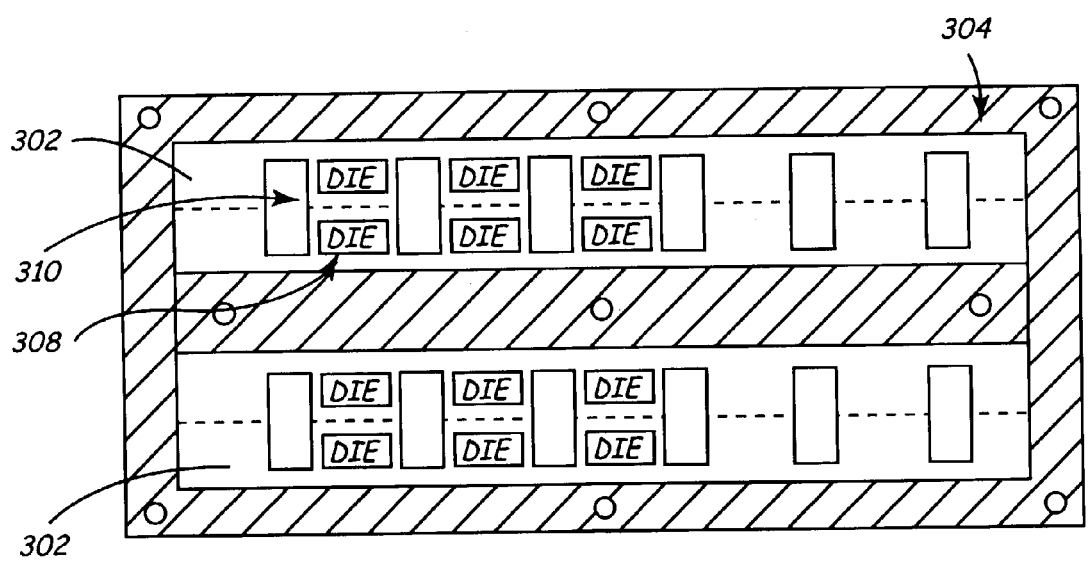
FIG. 3 is a top view of a stiffened substrate according to one embodiment of the present invention.

An embodiment 300 of a stiffened substrate is shown in FIG. 3. Stiffened substrate 300 comprises a flexible substrate 302 which has been mounted or otherwise attached to a stiffener or stiffening frame 304. On substrate 302, a sub panel layout 306 is arranged on the substrate 302 in such a pattern as to allow folding of the substrate 302 and stiffener 304 to align chips 308 mounted to the substrate 302. In one embodiment, the substrate includes open areas 310 arranged to facilitate folding of the substrate 302 and stiffener 304.

While a stiffener such as stiffener 304 is described herein, other means or components for maintaining rigidity and workability of the substrate are contemplated, and are within the scope of the invention. For example, in one embodiment, a spacer is used instead of the stiffener.

Figure 4A:
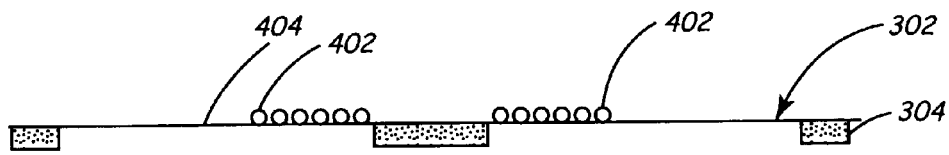
FIGS. 4A, 4B, 4C, 4D, 4E, and 4F are elevation views of a stacked die package in manufacture.

Once the substrate 302 is stiffened with stiffener 304, it undergoes in one embodiment the processes described above. These processes are shown in greater detail on FIGS. 4A, 4B, 4C, 4D, 4E, and 4F. FIG. 4A shows a substrate 302 stiffened by a stiffener 304. An array 402 of solder balls is formed on side 404 of the substrate in a pattern that has been determined to be acceptable for the stacking operation.

Figure 4B:
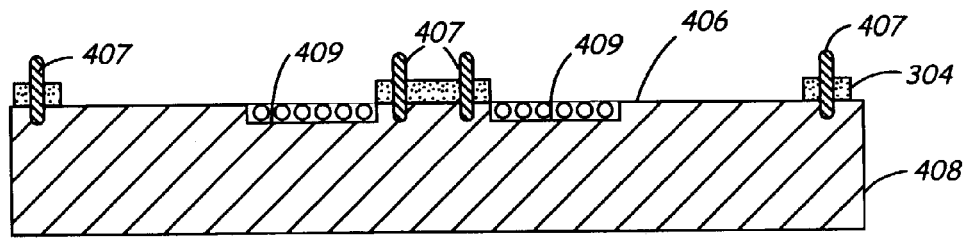

In FIG. 4B, the substrate/stiffener is placed on a reflow boat 408 inverted, so that the solder ball arrays rest in openings 409 of reflow boat 408. Reflow boat holding elements 407 secure the stiffener 304 and therefore the substrate 302 to the reflow boat 408 to allow further process flow. The inverted placement of the substrate 302 and stiffener 304 exposes opposite side 406 of the substrate 302 for further processing.

Figure 4C:
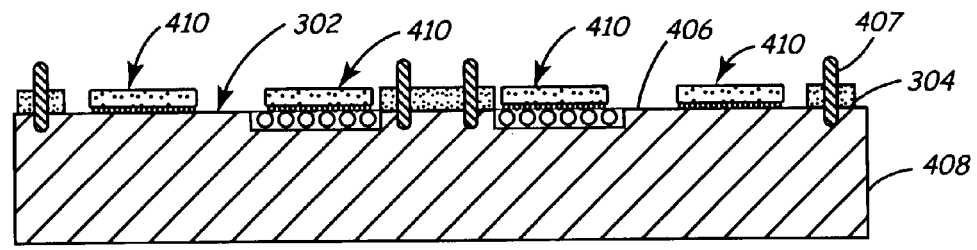

In FIG. 4C, chips 410 are mounted and reflowed onto side 406 of substrate 302 according to a predetermined pattern as described above. The chips 410 and the solder ball array 402 are electrically interconnected through the substrate 302.

Figure 4D:
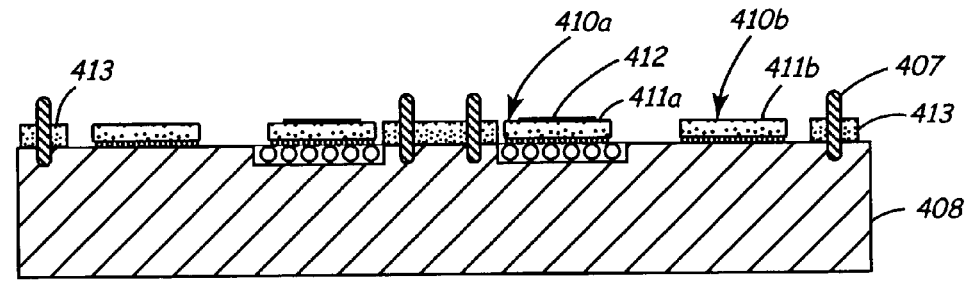

In FIG. 4D, adhesive 412 is placed on the tops 411 of selected chips 410 in preparation for adhering chips together in a stacking operation.

Figure 4E:
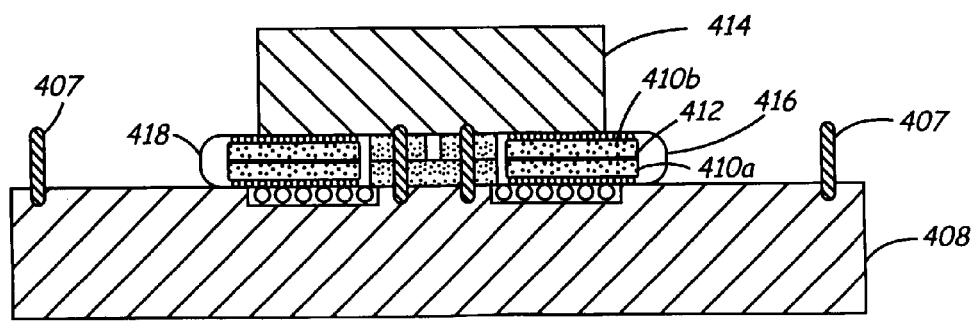

In FIG. 4E, the stiffener end sections 413 are removed from the, reflow boat/foundation securing elements 407 and the substrate 302 and stiffener 304 are folded along predetermined fold lines such as folds 416 and 418 to align chips such as chips 410$a$ and 410$b$ top 411$a$ to top 411$b$. Adhesive 412 secures the chips together. Once the substrate 302 and stiffener 304 are folded to align or abut chips such as chips 410, the assembly is clamped with clamp 414, and the adhesive is cured. Other chips 410 are also aligned top to top with each other in the same or additional folding operations.

Figure 4F:
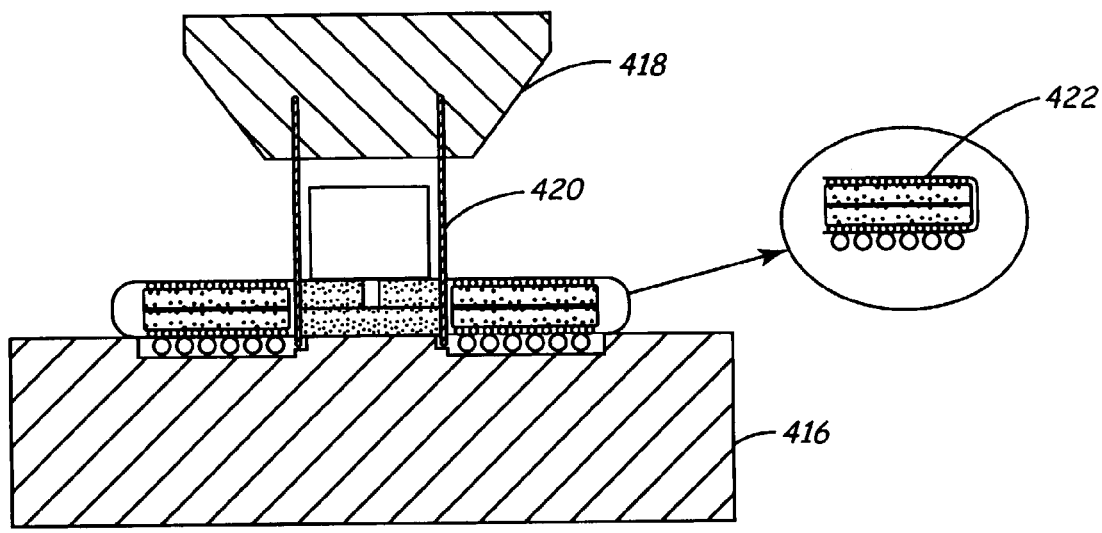

In FIG. 4F, once the adhesive 412 is fully cured, and the chips 410 are secured together in top to top stacked fashion, the assembly 300 is removed from the reflow boat and placed into a saw fixture 416. A wafer saw 418 is used to singulate the assembly 300 into individual piece parts 422 using saw blades 420. In one embodiment, the wafer saw 418 is a dual blade saw. The arrangement of chips such as chips 410 on the substrate such as substrate 302 is such in one embodiment that the wafer saw 418 cuts all the individual piece parts 422 into singular parts with one saw cut. When the wafer saw 418 cuts the assembly 300, the stiffener 304 is fully removed from the substrate 302, leaving only a stacked die package 422. The individual stacked die packages 422 are then ready for mounting by conventional surface mount technology.

Figure 5:
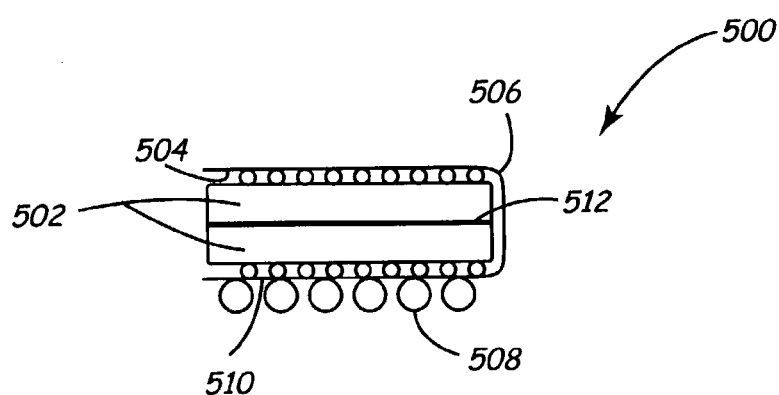
FIG. 5 is a view of a stacked die package according to one embodiment of the present invention.

FIG. 5 shows a stacked die package 500 comprising a stacked array of chips 502 mounted on a side 504 of a flexible substrate 506 folded to accommodate mounting with surface mount elements 508 on a side 510 of the substrate opposite the chips. The chips 502 are adhered together by an adhesive layer 512. Through-substrate routing (not shown) electrically connects the chips and the surface mount elements 506. In one embodiment, the surface mount elements 508 are solder balls of a solder ball array.

In one embodiment, the flexible substrate 506 has formed therein a sub panel layout for the layout of chips such as chips 502 so that folding of the substrate 506 aligns or abuts the chips 502 top to top. Multiple individual designs are laid out on the substrate 506 in one embodiment. The substrate folds along predetermined patterns to align the chips together as desired.

Figure 6:
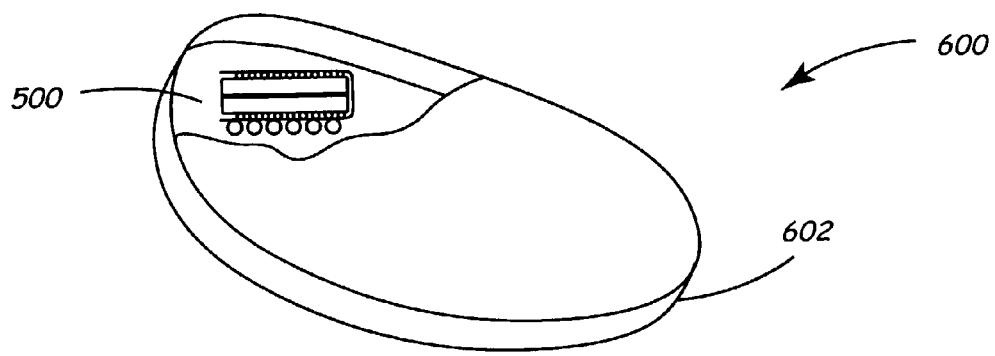
FIG. 6 is a view of an implantable medical device according to one embodiment if the present invention.

In another embodiment shown in FIG. 6, an implantable medical device 600 comprises a body 602 housing medical device components including by way of example only and not by way of limitation substrates, batteries, shielding, antenna and telemetry devices and components, control circuitry, high power circuits, integrated circuits, and the like. Integrated circuits include stacked die packages such as stacked die package 500. In one embodiment, the stacked die package such as a stacked die package 500 is mounted to the substrate of the implantable medical device by conventional surface mount techniques.

Recently, high voltage flip chip designs have been implemented in implantable medical devices. Such a high voltage flip chip design is not described herein, but the methods and devices of the present invention are also amenable and applicable to use in high voltage flip chip stacked die packages.

In another embodiment, the substrates of the present invention are laid out in a format wherein the components to be stacked are not the same size. With proper arrangement and chip layout, chips or components of different sizes are stacked in the same manner as that described above.

Most electronic devices can afford the extra volume of previous larger footprint designs. However, decreased volume and space are a market driver for implantable medical devices, specifically, and other medical devices. Stacking dice significantly reduces the area required on hybrid modules and therefore decreases the necessary volume of the module. The stacked die packages of the present invention embodiments have smaller footprints, but typically have increased vertical height over traditional packages due to the stacking of chips. The increase in vertical height due to the use of stacked die packages is not a critically limiting factor due to the use of other high profile components in such devices.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method for making a stacked die package, comprising:
   mounting at least two chips on a first side of a flexible substrate;
   forming solder balls on a second side of the substrate;
   interconnecting the chips and the solder balls through the substrate;
   stacking the chips to form the stacked die package;
   surface mounting the stacked die package;
   stiffening the substrate with a stiffener; and
   cutting the stiffener away after folding the substrate to stack the chips.

2. The method of claim 1, wherein the chips are surface mounted.

3. The method of claim 1, wherein the chips are flip chips.

4. The method of claim 1, wherein the substrate includes a sub panel format with multiple images of individual designs.

5. The method of claim 1, wherein the flexible substrate is stiffened by a printed wiring board.

6. The method of claim 1, wherein culling is performed with a single saw cut.

7. The method of claim 1, wherein stacking the chips comprises:
   folding the substrate to abut chips together top to top; and
   adhering abutting chips to one another.

8. The method of claim 1, and further comprising:
   underfilling the flip chips after mounting and reflowing.

9. The method of claim 1, wherein mounting comprises:
   placing the substrate on a reflow boat;
   laying out chips in a predetermined pattern; and
   reflowing the chips to the substrate.

10. A method for forming a stacked die package, comprising:
    stiffening a flexible substrate with a stiffener frame;
    forming an array of mounting elements on a first side of the flexible substrate;
    positioning the substrate mounting elements down on a reflow boat;
    mounting and reflowing a plurality of chips on a second side of the flexible substrate in a predetermined pattern;
    slacking the chips; and
    removing the substrate stiffener.

11. The method of claim 10, wherein removing the stiffener comprises:
    sawing the stiffener away.

12. The method of claim 11, wherein sawing is accomplished with a single saw cut.

13. The method of claim 10, wherein stacking the chips comprises:
    folding the substrate and stiffener in a predetermined pattern;
    aligning chips to be stacked; and
    adhering the stacked chips together.

14. The method of claim 13, wherein adhering comprises:
    applying an adhesive to the chips; and
    folding the substrate to stack the chips.

15. The method of claim 10, and further comprising:
    underfilling the chips.

16. The method of claim 10, wherein the stiffener is a printed wiring board frame disposed around a perimeter of the substrate.

17. The method of claim 10, wherein the stiffener is a spacer.

18. The method of claim 10, wherein the stiffener is a metal frame.

19. A method of forming a stacked die package, comprising:
    stiffening a substrate with a stiffener;
    forming solder balls on a back side of a substrate;
    placing the substrate on a reflow boat with the back side facing down;
    mounting at least two chips in a predetermined pattern on a front side of the substrate;
    dispensing adhesive on a portion of the chips;
    removing a portion of the stiffener;
    folding the substrate and remaining stiffener to align the remaining portion of the chips with the portion of the chips having adhesive; and
    curing the adhesive.

20. The method of claim 19, and further comprising:
    removing the remaining portion of the stiffener after curing.

21. The method of claim 20, wherein removing the remaining portion of stiffener is accomplished with a single saw cut.

22. A method of making a stacked die package, comprising:
    designing a substrate in sub panel format for folding to abut mounted chips top to top;
    stiffening the substrate with a printed wiring board stiffener;
    forming an array of solder balls on a side of the substrate;
    mounting a plurality of chips on another side of the substrate in the sub panel arrangement;
    folding the substrate to abut the mounted chips; and
    removing the stiffener after adhering the chips top to top.

* * * * *